United States Patent
Watanabe et al.

(10) Patent No.: US 10,547,053 B2
(45) Date of Patent: Jan. 28, 2020

(54) NEGATIVE ELECTRODE ACTIVE MATERIAL FOR ELECTRIC DEVICE, NEGATIVE ELECTRODE FOR ELECTRIC DEVICE AND ELECTRIC DEVICE

(71) Applicant: NISSAN MOTOR CO., LTD., Kanagawa (JP)

(72) Inventors: Manabu Watanabe, Yokosuka (JP); Osamu Tanaka, Yokosuka (JP); Masao Yoshida, Zushi (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 234 days.

(21) Appl. No.: 14/368,578

(22) PCT Filed: Nov. 5, 2012

(86) PCT No.: PCT/JP2012/078601
§ 371 (c)(1),
(2) Date: Jun. 25, 2014

(87) PCT Pub. No.: WO2013/099440
PCT Pub. Date: Jul. 4, 2013

(65) Prior Publication Data
US 2014/0374666 A1    Dec. 25, 2014

(30) Foreign Application Priority Data
Dec. 27, 2011    (JP) .................................. 2011-284660

(51) Int. Cl.
*H01M 4/38*    (2006.01)
*C23C 14/14*    (2006.01)
*C23C 14/06*    (2006.01)
*C22C 13/00*    (2006.01)
(Continued)

(52) U.S. Cl.
CPC ............. *H01M 4/386* (2013.01); *C22C 13/00* (2013.01); *C22C 30/04* (2013.01); *C23C 14/06* (2013.01);
(Continued)

(58) Field of Classification Search
CPC ....................................................... H01B 1/04
See application file for complete search history.

(56) References Cited

U.S. PATENT DOCUMENTS 6,730,434 B1 *   5/2004   Kawakami .............. C22C 45/00
                                                                 429/218.1
2006/0040182 A1   2/2006   Kawakami et al.
(Continued)

FOREIGN PATENT DOCUMENTS

EP    2239803 A1    10/2010
JP    2004311429 A  11/2004
(Continued)

OTHER PUBLICATIONS

M.A.Al-Maghrabi et al.; A Combinatorial Study of the Sn—Si—C System for Li-Ion Battery Applications; Journal of the Electrochemical Society; Apr. 2, 2012, 159 (6), pp. A711-A719.

*Primary Examiner* — William D Young
(74) *Attorney, Agent, or Firm* — Young Basile Hanlon & MacFarlane, P.C.

(57) ABSTRACT

A negative electrode active material for an electric device includes an alloy containing greater than or equal to 29% by mass of silicon and containing tin, carbon and inevitable impurities as a residue.

8 Claims, 7 Drawing Sheets

(51) Int. Cl.
    *C22C 30/04*     (2006.01)
    *C23C 14/34*     (2006.01)
    *H01M 4/04*     (2006.01)
    *C22C 32/00*     (2006.01)
    *C22C 1/04*     (2006.01)
    *H01M 10/0525*     (2010.01)

(52) U.S. Cl.
    CPC .......... *C23C 14/14* (2013.01); *C23C 14/3464* (2013.01); *C22C 1/0483* (2013.01); *C22C 32/0084* (2013.01); *H01M 4/0426* (2013.01); *H01M 10/0525* (2013.01); *H01M 2220/20* (2013.01)

(56) References Cited

U.S. PATENT DOCUMENTS

| | | | |
|---|---|---|---|
| 2006/0068285 A1 | 3/2006 | Yamaguchi et al. | |
| 2008/0003503 A1 | 1/2008 | Kawakami et al. | |
| 2010/0119942 A1* | 5/2010 | Kumar | H01M 4/38 429/220 |
| 2010/0270497 A1 | 10/2010 | Hezeque et al. | |
| 2011/0084229 A1 | 4/2011 | Kawakami et al. | |
| 2014/0261899 A1* | 9/2014 | Le | H01M 4/134 148/403 |

FOREIGN PATENT DOCUMENTS

| | | | |
|---|---|---|---|
| JP | 2006107795 A | | 4/2006 |
| JP | 2007-149604 | * | 6/2007 |
| JP | 2008016446 A | | 1/2008 |
| JP | 2008034334 A | | 2/2008 |

* cited by examiner

US 10,547,053 B2

NEGATIVE ELECTRODE ACTIVE MATERIAL FOR ELECTRIC DEVICE, NEGATIVE ELECTRODE FOR ELECTRIC DEVICE AND ELECTRIC DEVICE

CROSS REFERENCE TO RELATED APPLICATION

The present application claims priority to Japanese Patent Application No. 2011-284660, filed Dec. 27, 2011 and incorporated herein in its entirety.

TECHNICAL FIELD

The present invention relates to a negative electrode active material for an electric device, as represented by a secondary battery or a capacitor, used as a power source for driving a motor for use in a vehicle such as an electric vehicle (EV) and a hybrid electric vehicle (HEV).

BACKGROUND

Various measures for reduction of emissions of carbon dioxide ($CO_2$) are being adopted in order to deal with atmospheric pollution and global warming. In the automobile industry, the reduction of emissions of $CO_2$ is highly expected in association with the spread of electric vehicles and hybrid electric vehicles. Thus, development of high-performance secondary batteries used as power sources for driving motors for use in these vehicles is being carried out.

In particular, a higher capacity and cycle property are required for the secondary batteries used for driving the motors. In view of this, lithium ion secondary batteries having high theoretical energy are gaining increasing attention among other types of secondary batteries. The lithium ion secondary batteries are required to store a large amount of electricity in positive electrodes and negative electrodes per unit mass in order to increase energy density in the lithium ion secondary batteries. Thus, it is quite important for the lithium ion secondary batteries to determine appropriate active materials used in the respective electrodes so as to fulfill such a requirement.

There are proposed an electrode material and an electrode structure capable of improving performance of a lithium ion secondary battery with low resistivity, high charge-discharge efficiency and high capacity, and proposed a secondary battery using these electrode material and electrode structure (for example, refer to Japanese Unexamined Patent Application Publication No. 2004-311429).

In particular, the electrode material disclosed includes solid-state alloy particles mainly containing silicon, in which a microcrystalline or amorphous substance containing an element other than silicon is dispersed in microcrystalline silicon or amorphous silicon.

However, in the lithium ion secondary battery using the electrode material described in Japanese Unexamined Patent Application Publication No. 2004-311429, a shift from an amorphous state to a crystalline state is caused when silicon (Si) is alloyed with lithium (Li), which leads to a great change in volume. Thus, there is a problem of resulting in a decrease in cycle life of the electrode.

In addition, in the case that the Si series active material is used, a capacity generally has a trade-off relationship with cycle durability. Thus, there has been a demand for development of active materials capable of concurrently ensuring a high capacity and improving cycle durability.

SUMMARY

The present invention has been made in view of the conventional problem. An object of the present invention is to suppress amorphous-crystal phase transition so as to extend cycle life in a negative electrode active material for an electric device such as a lithium ion secondary battery. Another object of the present invention is to provide a negative electrode active material capable of ensuring a high capacity. Still another object of the present invention is to provide a negative electrode for an electric device, an electric device and a lithium ion secondary battery using such a negative electrode active material.

A negative electrode active material for an electric device according to an aspect of the present invention includes an alloy containing greater than or equal to 29% by mass of silicon and containing tin, carbon and inevitable impurities as a residue.

DESCRIPTION OF EMBODIMENTS

Figure 1:
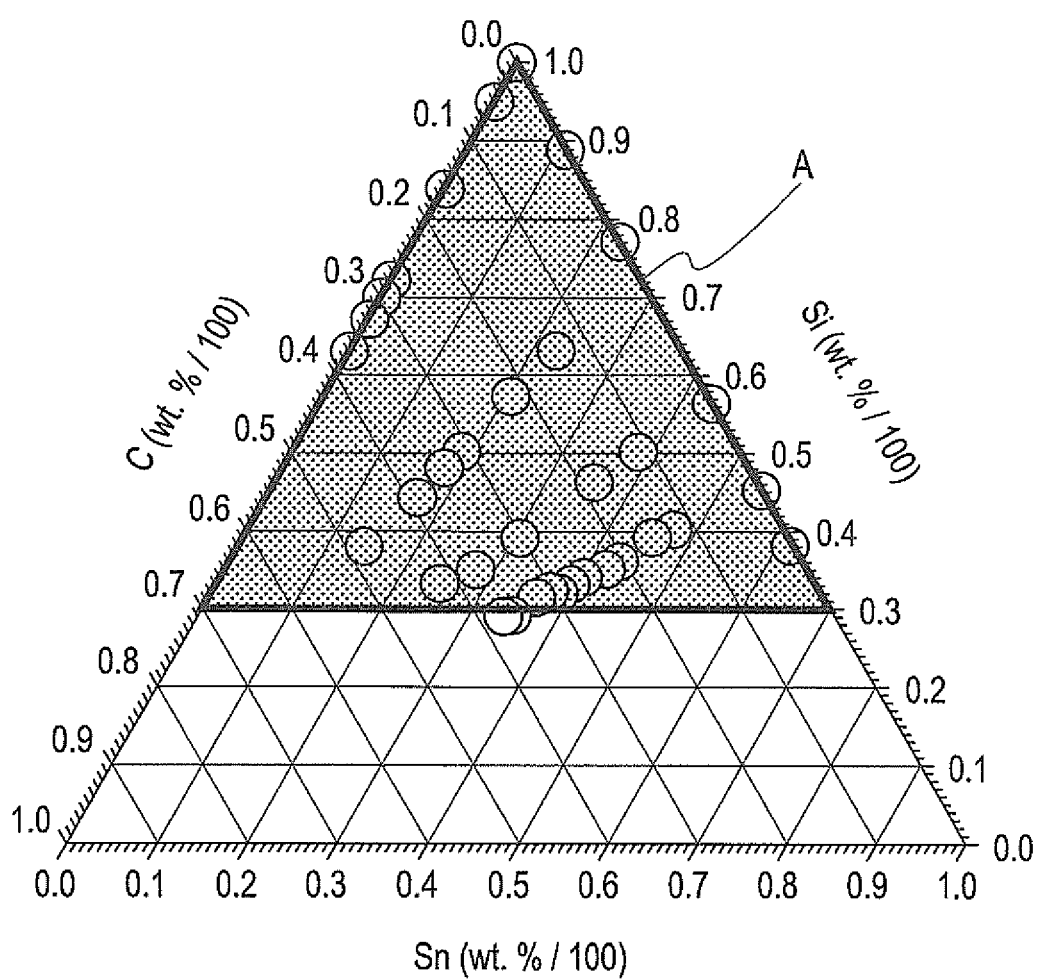
FIG. 1 is a ternary composition diagram showing composition ranges of a Si—Sn—C series alloy contained in a negative electrode active material for an electric device according to an embodiment of the present invention, wherein an alloy composition obtained for each example is plotted.

Hereinafter, a negative electrode active material for an electric device according to an embodiment of the present invention will be explained in detail while exemplifying a negative electrode for a lithium ion secondary battery and a lithium ion secondary battery using the negative electrode active material. Here, in the present description, the symbol "%" represents a percentage by mass unless otherwise specified. It should be noted that dimensional ratios in the drawings are magnified for convenience of explanation and may be different from actual ratios.

[Negative Electrode Active Material for Electric Device]

A negative electrode active material for an electric device according to the embodiment of the present invention includes an alloy containing greater than or equal to 29% by mass of silicon (Si) and containing tin (Sn), carbon (C) and inevitable impurities as a residue. The numerical range is included in the area indicated by reference sign A shown in FIG. 1. This negative electrode active material for an electric device is used in a negative electrode for an electric device, typically for a lithium ion secondary battery. In such a case, the alloy contained in the negative electrode active material for an electric device absorbs lithium ions when the battery is charged and releases the lithium ions when the battery is discharged.

In particular, the negative electrode active material for an electric device according to the embodiment of the present invention is a silicon series active material, to which Sn as a first additive element and C as a second additive element are added. The addition of Sn selected as a first additive element and C selected as a second additive element can suppress amorphous-crystal phase transition when being alloyed with Li so as to extend cycle life. In addition, such a negative electrode active material can ensure a higher capacity compared with conventional negative electrode active materials, for example, carbon series negative electrode active materials. The composition ranges of Sn and C as the first and second additive elements optimally determined contributes to providing the negative electrode active material containing the Si series alloy capable of exhibiting better cycle life after 50 cycles and even after 100 cycles.

In the negative electrode active material for an electric device containing the Si—Sn—C series alloy according to the embodiment of the present invention, if the content of each component does not fall within the above-described range, the cycle durability decreases and the capacity retention of greater than or equal to 45% after 100 cycles may not be ensured.

Figure 2:
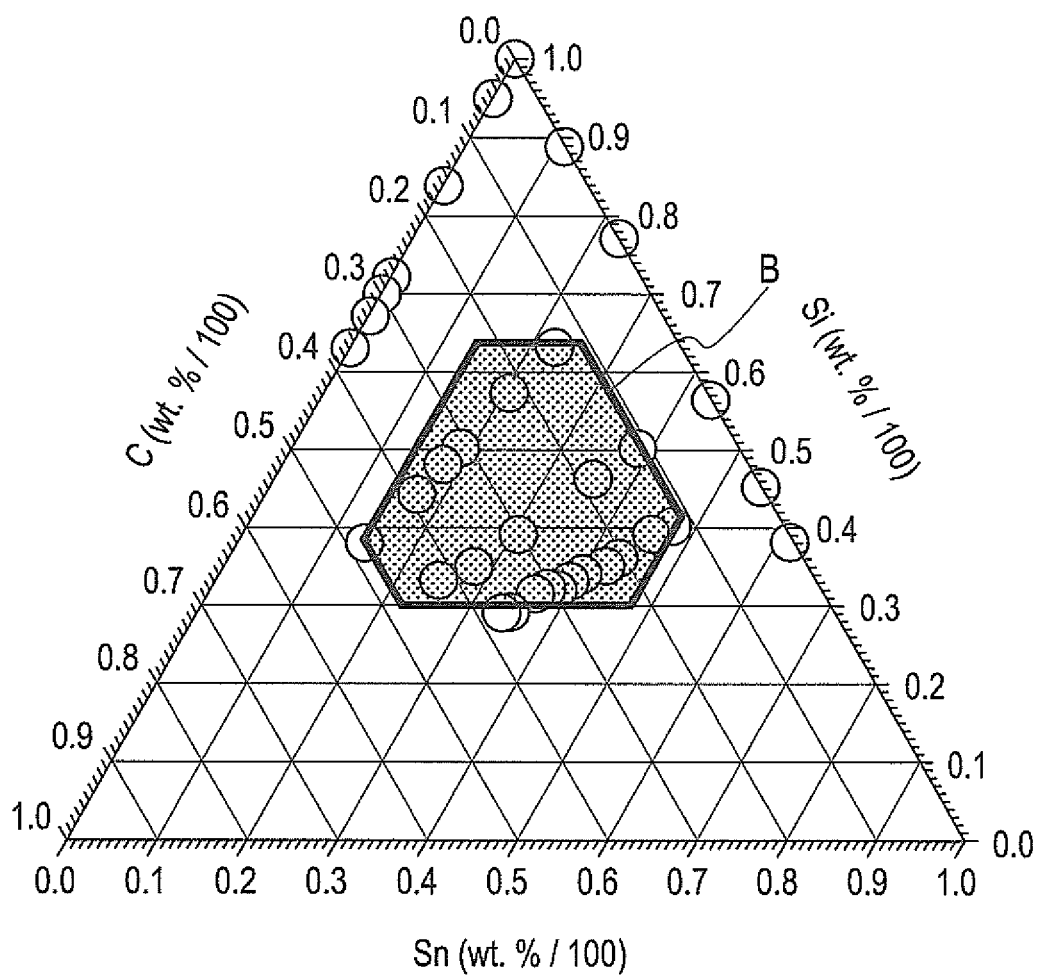
FIG. 2 is a ternary composition diagram showing preferred composition ranges of the Si—Sn—C series alloy contained in the negative electrode active material for an electric device according to the embodiment of the present invention.

In order to further improve the properties of the negative electrode active material, the composition preferably includes Si in the range from 29% by mass to 63% by mass, Sn in the range from 14% by mass to 48% by mass, and C in the range from 11% by mass to 48% by mass. These composition ranges contribute to ensuring a discharge capacity retention of greater than or equal to 92% after 50 cycles and a discharge capacity retention of greater than or equal to 45% after 100 cycles. These numerical ranges are included in the area indicated by reference sign B shown in FIG. 2.

Figure 3:
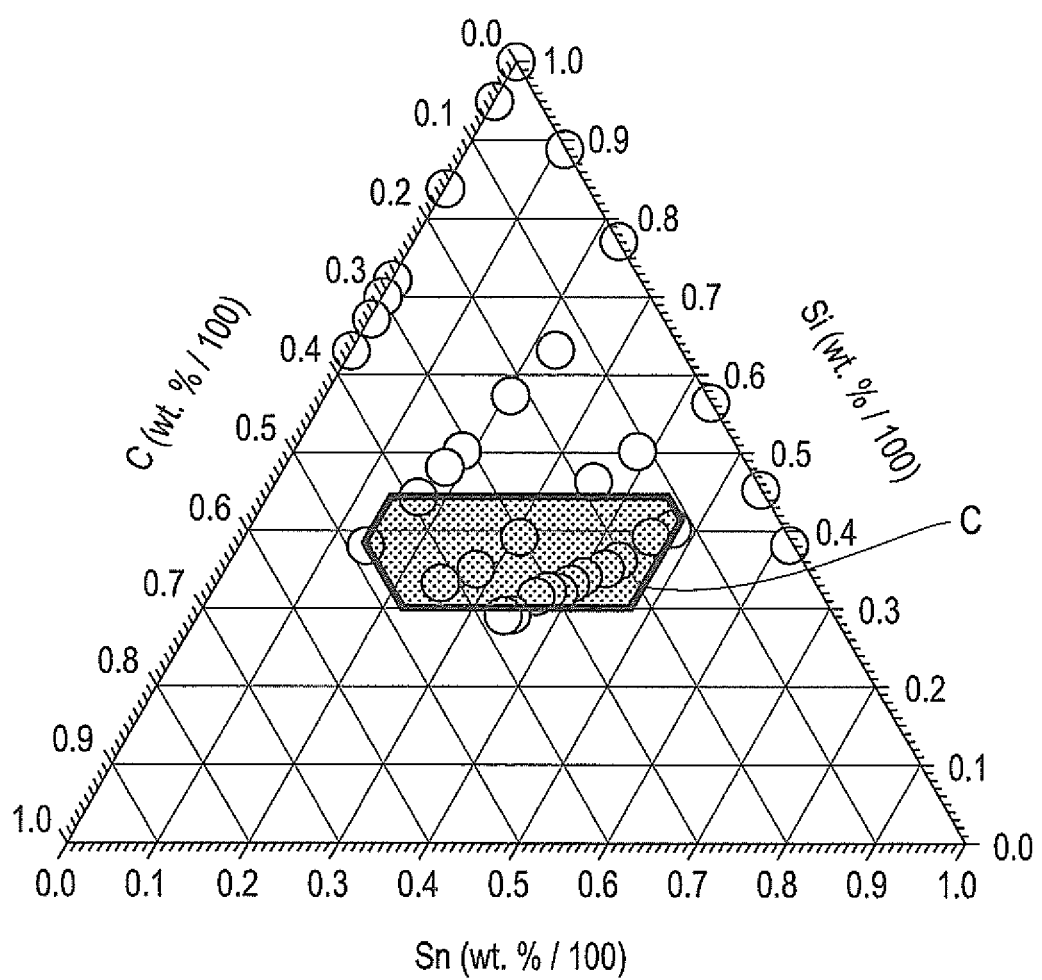
FIG. 3 is a ternary composition diagram showing further preferred composition ranges of the Si—Sn—C series alloy contained in the negative electrode active material for an electric device according to the embodiment of the present invention.

In order to achieve a higher cycle property, the composition preferably includes Si in the range from 29% by mass to 44% by mass, Sn in the range from 14% by mass to 48% by mass, and C in the range from 11% by mass to 48% by mass. These composition ranges contribute to improving the cycle durability and ensuring a discharge capacity retention of greater than or equal to 50% after 100 cycles. These numerical ranges are included in the area indicated by reference sign C shown in FIG. 3.

Figure 4:
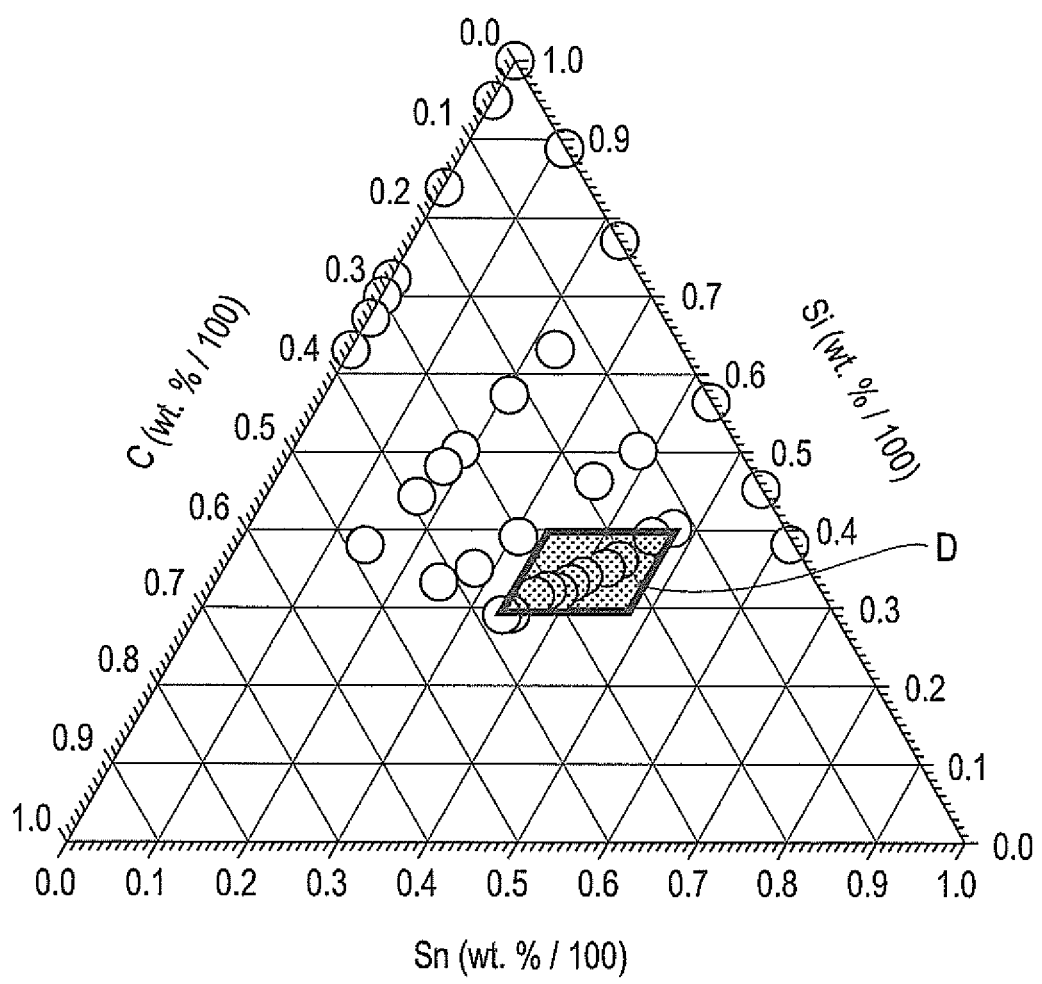
FIG. 4 is a ternary composition diagram showing still further preferred composition ranges of the Si—Sn—C series alloy contained in the negative electrode active material for an electric device according to the embodiment of the present invention.

The composition more preferably includes Si in the range from 29% by mass to 40% by mass and Sn in the range from 34% by mass to 48% by mass (namely, 12% by mass<C<37% by mass). These composition ranges contribute to further improving the cycle durability and ensuring a discharge capacity retention of greater than or equal to 96% after 50 cycles and a discharge capacity retention of greater than or equal to 55% after 100 cycles. These numerical ranges are included in the area indicated by reference sign D shown in FIG. 4.

Here, the negative electrode active material according to the embodiment of the present invention inevitably contains impurities derived from the raw materials and the production method, in addition to the three elements described above. The content of the inevitable impurities is preferably less than 0.5% by mass, more preferably less than 0.1% by mass.

As described above, the alloy contained in the negative electrode active material according to the present embodiment contains greater than or equal to 29% by mass of Si and contains Sn, C and inevitable impurities as a residue. Namely, the alloy consists of Si with content of greater than or equal to 29% by mass, Sn, C and inevitable impurities.

A method for manufacturing the negative electrode active material according to the embodiment of the present invention, which is the Si—Sn—C series alloy having the above-described composition, is not particularly limited, and conventionally known various methods may be employed. Namely, any conventional manufacturing methods may be used without any particular obstacle, since there is little difference in the conditions and characteristics of the alloy depending on the manufacturing methods. For example, a multi PVD method (a sputtering method, a resistance heating method and a laser ablation method) or a multi CVD method (a chemical vapor-phase growth method) may be used to obtain an alloy in a thin film state having the composition described above.

Such an alloyed thin film can be directly formed on (applied to) a current collector so as to obtain a negative electrode and therefore has the advantage of simplification of the manufacturing process. In addition, the alloyed thin film need not use other components, such as a binder and an electric conducting additive, composing a negative electrode active material layer other than the alloy (the negative electrode active material). Therefore, the alloyed thin film as the negative electrode active material can simply be used for the negative electrode. Accordingly, the alloyed thin film also has the advantage of ensuring a high capacity and high energy density which satisfy the level suitable for practical use in vehicles. Furthermore, the alloyed thin film is suitable for analysis of the electrochemical characteristics of the active material.

The alloyed thin film may be manufactured by use of a multi DC magnetron sputtering apparatus, such as an independently controllable ternary DC magnetron sputtering apparatus. This apparatus may freely form Si—Sn—C series alloyed thin films having various alloy constitutions and thicknesses on the surface of the substrate (the current collector).

For example, ternary series alloy samples having various constitutions can be obtained in such a manner as to use target 1 (Si), target 2 (Sn) and target 3 (C), fix the sputtering time, and change the power level of the DC power source to 185 W for Si, in the range from 0 W to 35 W for Sn, and in the range from 0 W to 180 W for C. It should be noted that, since sputtering conditions depend on sputtering devices, it is preferable to estimate appropriate ranges of the sputtering conditions through preliminary tests for each sputtering device.

As described above, the negative electrode active material layer according to the embodiment of the present invention can use the Si—Sn—C series alloyed thin film. Alternatively, the negative electrode active material layer may be a layer containing particles of the Si—Sn—C series alloy as a main component. An example of a method for manufacturing the alloy in a particle state may be a mechanical alloying method or a roll rapid cooling method after arc plasma melting.

When the alloy in the particle state is used as the negative electrode active material, slurry is prepared first in a manner such that a binder, an electric conducting additive and a viscosity control solvent are added to the alloy particles. The slurry thus obtained is then applied to the current collector to form the negative electrode active material layer so as to obtain the negative electrode. Such a process is superior in terms of mass production and practicality for actual battery electrodes.

When the alloy in the particle state is used as the negative electrode active material, the average particle diameter of the particles is not particularly limited as long as it is substantially the same as that employed in conventional negative electrode active materials. Here, in view of higher output power, the average particle diameter is preferably in the range from 1 μm to 20 μm. However, the average particle diameter is not limited thereto and does not necessarily fall within this range as long as it can effectively achieve the effects according to the embodiment of the present invention.

Note that, in the description of the present invention, "the particle diameter" represents the greatest length between any two points on the circumference of the active material particle (the observed plane) observed by observation means such as a scanning electron microscope (SEM) or a transmission electron microscope (TEM). In addition, "the average particle diameter" represents a value calculated with SEM or TEM as an average value of particle diameters of the particles observed in several to several tens of fields of view. Particle diameters and average particle diameters of other constituents may be determined in the same manner.

[Negative Electrode for Electric Device and Electric Device]

Figure 5:
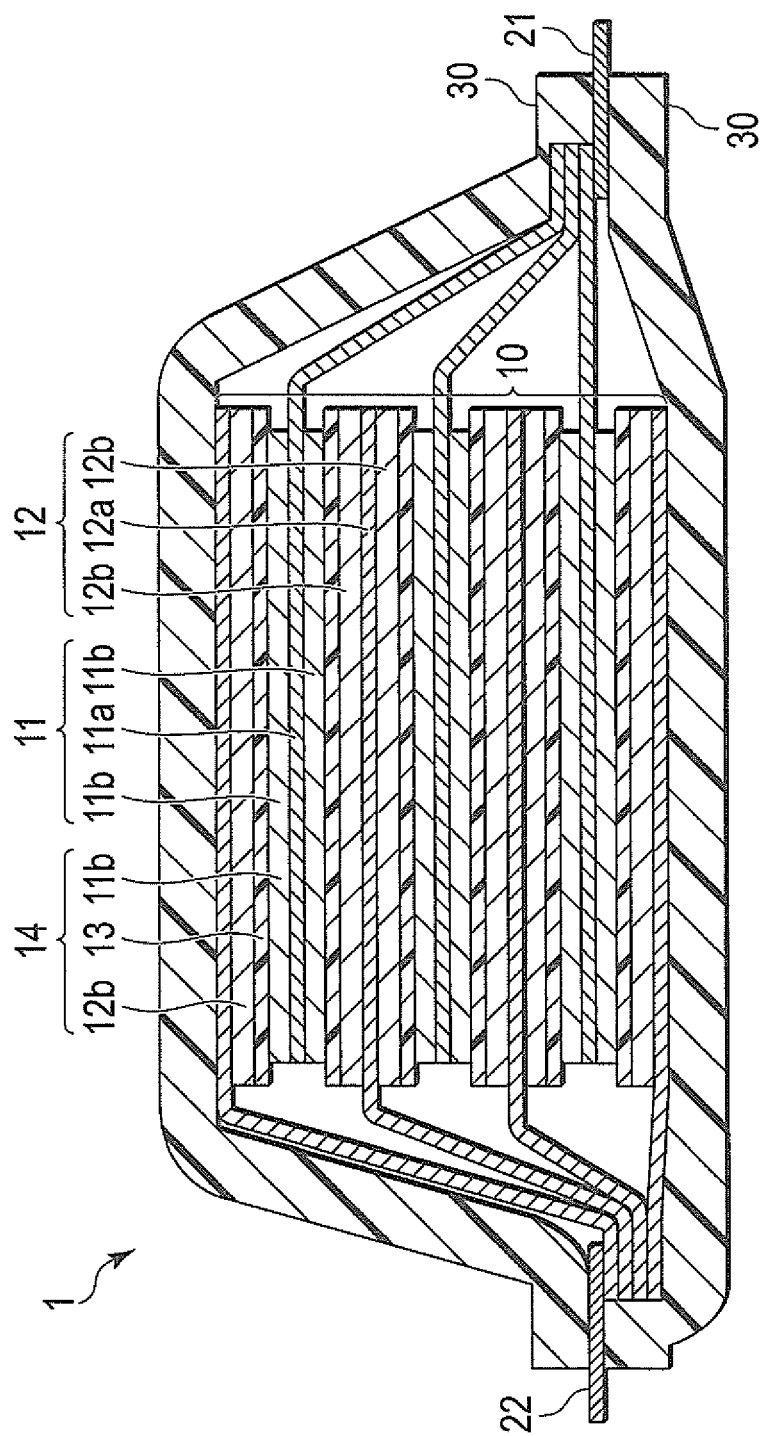
FIG. 5 is a schematic cross-sectional view showing an example of a lithium ion secondary battery according to an embodiment of the present invention.

A negative electrode for an electric device according to an embodiment of the present invention includes the negative electrode active material containing the Si—Sn—C series alloy described above. Representative examples of the electric device include a lithium ion secondary battery and an electrical double layer capacitor. The lithium ion secondary battery generally has a configuration, as shown in FIG. 5, in which positive electrodes 11 and negative electrodes 12 are connected via electrolyte layers 13, each positive electrode 11 having a configuration in which a positive electrode active material and the like is applied to a positive electrode current collector, each negative electrode 12 having a configuration in which a negative electrode active material and the like is applied to a negative electrode current collector. The positive electrodes 11, the electrolyte layers 13 and the negative electrodes 12 are housed in a battery case. The respective components of the lithium ion secondary battery and the materials used therein are explained in detail below.

(Positive Electrode)

The positive electrode 11 in the lithium ion secondary battery 1 according to the embodiment of the present invention has a configuration in which positive electrode active material layers 11b are formed on both surfaces of a positive electrode current collector 11a. The positive electrode current collector 11a preferably contains an electrically conductive material such as aluminum foil, copper foil, nickel foil or stainless foil. The thickness of the positive electrode current collector 11a is not particularly limited but is generally preferably in the range from 1 μm to 30 μm.

The positive electrode active material layer 11b contains an electric conducting additive and a binder as necessary together with the positive electrode active material. The content ratio of the positive electrode active material, the electric conducting additive and the binder in the positive electrode active material layer 11b is not particularly limited.

Examples of the positive electrode active material include a lithium-transition metal composite oxide, a lithium-transition metal phosphate compound, a lithium-transition metal sulfated compound, a solid solution series material, a ternary series material, a NiMn series material, a NiCo series material, and a spinel manganese series material.

Examples of the lithium-transition metal composite oxide include $LiMn_2O_4$, $LiCoO_2$, $LiNiO_2$, $Li(Ni, Mn, Co)O_2$, $Li(Li, Ni, Mn, Co)O_2$, $LiFePO_4$, and an oxide in which part of the transition metal contained in each of these composite oxides is replaced with other elements. An example of the lithium-transition metal phosphate compound may be $LiFePO_4$. An example of the lithium-transition metal sulfated compound may be $Li_xFe_2(SO_4)_3$. Examples of the solid solution series material include $xLiMO_2 \cdot (1-x)Li_2NO_3$ (where $0<x<1$, M represents at least one transition metal in an average oxidation state of 3+, and N represents at least one transition metal in an average oxidation state of 4+), and $LiRO_2$—$LiMn_2O_4$ (where R represents a transition metal element such as Ni, Mn, Co and Fe). The ternary series material may be a nickel-cobalt-manganese composite positive electrode material. The spinel manganese series material may be $LiMn_2O_4$. The NiMn series material may be $LiNi_{0.5}Mn_{1.5}O_4$. The NiCo series material may be $Li(NiCo)O_2$. Two or more kinds of the positive electrode active materials may be combined together according to circumstances. In view of a high capacity and output performance, the lithium-transition metal composite oxide is preferably used for the positive electrode active material.

The particle diameter of the positive electrode active material is not particularly limited; however, it is generally preferably as small as possible. In view of operation efficiency and ease of handling, the average particle diameter may be approximately in the range from 1 μm to 30 μm, preferably approximately in the range from 5 μm to 20 μm. Other positive electrode active materials having different particle diameters may be used. In the case that the active materials require different particle diameters in order to achieve their own appropriate effects, the active materials having different particle diameters may be selected and mixed together so as to optimally function to achieve their own effects. Thus, it is not necessary to equalize the particle diameter of all of the active materials.

The binder in the positive electrode active material layer 11b is added to bind the active materials to each other or bind the active material to the positive electrode current collector 11a to maintain the electrode structure. The binder may be thermoplastic resin such as polyvinylidene fluoride (PVDF), polytetrafluoroethylene (PTFE), polyvinyl acetate, polyimide (PI), polyamide (PA), polyvinyl chloride (PVC), polymethyl acrylate (PMA), polymethyl methacrylate (PMMA), polyether nitrile (PEN), polyethylene (PE), polypropylene (PP), and polyacrylonitrile (PAN). Alternatively, the binder may be thermosetting resin such as epoxy resin, polyurethane resin, and urea resin, or a rubber material such as styrene-butadiene rubber (SBR).

The electric conducting additive in the positive electrode active material layer 11b is also referred to as an electric conducting agent added to improve electric conductivity. The electric conducting additive used in the embodiment of the present invention is not particularly limited, and a conventionally known agent may be used. The electric conducting additive may be a carbon material such as carbon black (such as acetylene black), graphite, and carbon fiber. The addition of the electric conducting additive contributes to effectively establishing an electronic network in the active material layer so as to improve output performance and battery reliability in association with an improvement in retention of an electrolysis solution.

(Negative Electrode)

The negative electrode 12 has a configuration, as in the case of the positive electrode 11, in which negative electrode active material layers 12b are formed on both surfaces of a negative electrode current collector 12a containing an electrically conductive material. The negative electrode current collector 12a preferably contains, as in the case of the positive electrode current collector 11a, an electrically conductive material such as aluminum foil, copper foil, nickel foil or stainless foil. The thickness of the negative electrode current collector 12a is preferably approximately in the range from 1 μm to 30 μm, as in the case of the positive electrode current collector 11a.

As described above, the negative electrode active material according to the present embodiment contains the Si—Sn—C series alloy having the above-described composition as an essential component. The negative electrode active material layer 12b according to the present embodiment may be a thin film including the Si—Sn—C series alloy as described above. In that case, the negative electrode active material layer may consist of the Si—Sn—C series alloy or may further contain a different negative electrode active material described below.

Alternatively, as described above, the negative electrode active material layer 12b may be a layer containing the particles of the Si—Sn—C series alloy as a main component. In that case, the negative electrode active material layer 12b may contain the electric conducting additive and the binder as necessary, which the positive electrode active material layer 11b may also contain. Note that, in the present description, "a main component" represents a component contained in the negative electrode active material layer 12b with content of greater than or equal to 50% by mass.

The lithium ion secondary battery as the electric device according to the embodiment of the present invention includes the negative electrode active material including the Si—Sn—C series alloy having the above-described composition. Note that a conventionally known negative electrode active material capable of reversibly absorbing and releasing lithium may be used together without any particular obstacle as long as the negative electrode active material containing the above-described alloy is included as an essential component.

The other negative electrode active material may be a carbon material such as graphite which is highly crystalline carbon (such as natural graphite and artificial graphite), low crystalline carbon (such as soft carbon and hard carbon), carbon black (such as Ketjenblack (registered trademark), acetylene black, channel black, lamp black, oil furnace black, and thermal black), fullerene, carbon nanotube, carbon nanofiber, carbon nanohorn, and carbon fibril. Another example of the negative electrode active material may be a single substance alloyed with lithium such as Si, Ge, Sn, Pb, Al, In, Zn, H, Ca, Sr, Ba, Ru, Rh, Ir, Pd, Pt, Ag, Au, Cd, Hg, Ga, Tl, C, N, Sb, Bi, O, S, Se, Te, and Cl, or an oxide and a carbide containing these elements. The oxide may be silicon monoxide (SiO), $SiO_x$, ($0<x<2$), tin dioxide ($SnO_2$), SnO ($0<x<2$), or $SnSiO_3$, and the carbide may be silicon carbide (SiC). Still another example of the negative electrode active material may be a metallic material such as lithium metal, or a lithium-transition metal composite oxide such as a lithium-titanium composite oxide (lithium titanate: $Li_4Ti_5O_{12}$).

The negative electrode 12 may be obtained in a manner such that slurry containing the negative electrode active material together with the electric conducting additive and the binder, is applied to the surface of the negative electrode current collector 12a to form the negative electrode active material layer 12b. Alternatively, the negative electrode 12 may be obtained in a manner such that a thin film of the negative electrode active material alloy is directly formed on the surface of the negative electrode current collector 12a by a multi PVD method or a multi CVD method.

As described above, the positive electrode active material layer and the negative electrode active material layer are each provided on one surface or both surfaces of the respective current collectors. Alternatively, one current collector may be provided with the positive electrode active material layer on one surface thereof and provided with the negative electrode active material layer on the other surface thereof. Electrodes having such a configuration are used for a bipolar battery.

(Electrolyte Layer)

The electrolyte layer 13 contains a non-aqueous electrolyte, which serves as a carrier of lithium ions moving between the positive electrode and the negative electrode during charge and discharge. The thickness of the electrolyte layer 13 is preferably reduced as much as possible so as to decrease internal resistance, and is generally approximately in the range from 1 μm to 100 μm, preferably in the range from 5 μm to 50 μm.

The non-aqueous electrolyte contained in the electrolyte layer 13 is not particularly limited as long as it functions as a carrier of lithium ions, and may be a liquid electrolyte or a polymer electrolyte.

The liquid electrolyte has a constitution in which lithium salt (electrolyte salt) is dissolved in an organic solvent. The organic solvent may be carbonate such as ethylene carbonate (EC), propylene carbonate (PC), butylene carbonate (BC), vinylene carbonate (VC), dimethyl carbonate (DMC), diethyl carbonate (DEC), ethyl methyl carbonate (EMC), and methyl propyl carbonate (MPC). The lithium salt may be a compound that can be added to the electrode active material layers of the electrodes, such as $Li(CF_3SO_2)_2N$, $Li(C_2F_5SO_2)_2N$, $LiPF_6$, $LiBF_4$, $LiAsF_6$, $LiTaF_6$, $LiClO_4$, and $LiCF_3SO_3$.

The polymer electrolyte is divided into two types; a gel polymer electrolyte (a gel electrolyte) containing an electrolysis solution, and an intrinsic polymer electrolyte not containing an electrolysis solution.

The gel polymer electrolyte preferably has a constitution in which the liquid electrolyte is poured into a matrix polymer (a host polymer) including an ion conductive polymer. The use of the gel polymer electrolyte has the advantage of decreasing fluidity of the electrolyte so as to easily interrupt ion conduction between the respective layers.

The ion conductive polymer used for the matrix polymer (the host polymer) is not particularly limited. Examples thereof include polyethylene oxide (PEO), polypropylene oxide (PPO), polyvinylidene fluoride (PVDF), a copolymer of polyvinylidene fluoride and hexafluoropropylene (PVDF-HFP), polyethylene glycol (PEG), polyacrylonitrile (PAN), polymethyl methacrylate (PMMA), and a copolymer of these compounds.

The ion conductive polymer may be the same as, or different from, an ion conductive polymer used as the electrolyte in the active material layers, but is preferably the same. The type of the electrolysis solution, namely, the lithium salt and the organic solvent, is not particularly limited and may employ the electrolyte salt such as the lithium salt exemplified above and the organic solvent such as the carbonate exemplified above.

The intrinsic polymer electrolyte has a constitution in which lithium salt is dissolved in the matrix polymer, but no organic solvent is contained. Thus, the use of the intrinsic polymer electrolyte contributes to reducing the risk of liquid leakage from the battery and thereby increasing reliability of the battery.

The matrix polymer of the gel polymer electrolyte or the intrinsic polymer electrolyte can exhibit high mechanical strength when a cross-linked structure is formed. The cross-linked structure may be formed in a manner such that a polymerizable polymer used for polymer electrolyte formation (for example, PEO and PPO) is subjected to polymerization, such as thermal polymerization, ultraviolet polymerization, radiation polymerization, and electron beam polymerization, by use of an appropriate polymerization initiator. The non-aqueous electrolyte contained in the electrolyte layer 13 may be used singly, or two or more kinds thereof may be mixed together.

Here, a separator is preferably used in the electrolyte layer 13 when the electrolyte layer 13 contains the liquid electrolyte or the gel polymer electrolyte. The specific configuration of the separator may be a microporous film containing polyolefin such as polyethylene and polypropylene.

(Positive Electrode Tab and Negative Electrode Tab)

As shown in FIG. 5, the lithium ion secondary battery 1 according to the present embodiment has a configuration in which a battery constituent 10 to which a positive electrode tab 21 and a negative electrode tab 22 are attached, is sealed in an exterior body 30. In the present embodiment, the positive electrode tab 21 and the negative electrode tab 22 are exposed to the outside of the exterior body 30 on opposite sides. Although not shown in the figure, the positive electrode tab and the negative electrode tab may be exposed to the outside of the exterior body on the same side. In addition, the positive electrode tab and the negative electrode tab may be attached to the positive electrode current collectors 11a and the negative electrode current collectors 12a by, for example, ultrasonic welding or resistance welding.

The positive electrode tab 21 and the negative electrode tab 22 are made of a material such as aluminum, copper, titanium, nickel, stainless steel (SUS), or an alloy thereof. However, the material is not limited thereto and may be any conventionally known material used for tabs for lithium ion secondary batteries.

The positive electrode tab 21 and the negative electrode tab 22 may be made of the same material, or may be made of different materials. The tabs may be prepared preliminarily and then connected to the positive electrode current collectors 11a and the negative electrode current collectors 12a, which is the configuration according to the present embodiment. Alternatively, each of the positive electrode current collectors 11a and the negative electrode current collectors 12a may be elongated to serve as the respective tabs. Although not shown in the figure, each part of the positive electrode tab 21 and the negative electrode tab 22 exposed to the outside of the exterior body 30 is preferably covered with, for example, a heat shrinkable tube having a heat resistant and insulating property. This configuration decreases the chances of any negative influence on surrounding products (such as components in a vehicle, in particular, electronic devices) caused by a short circuit because of contact of the positive electrode tab 21 and the negative electrode tab 22 with peripheral devices or wires.

In addition, current collecting plates may be used to extract and lead current to the outside of the battery. Such current collecting plates are electrically connected to the current collectors and leads and are exposed to the outside of the exterior body 30. The material constituting the current collecting plates is not particularly limited and may be a highly electrically conductive material conventionally used for current collecting plates for lithium ion secondary batteries. For example, the constituent material of the current collecting plates is preferably a metallic material such as aluminum, copper, titanium, nickel, stainless steel (SUS), or an alloy thereof, particularly preferably aluminum or copper in view of lightness, corrosion resistance and high electric conductivity. The positive electrode current collecting plates and the negative electrode current collecting plates may be made of the same material, or may be made of different materials.

(Exterior Body)

The exterior body 30 is preferably made of a film-like exterior material in view of, for example, a reduction in size and weight. However, the exterior body 30 is not limited thereto and may be a conventionally known material used for exterior bodies for lithium ion secondary batteries. Namely, a metal can casing may be used.

Here, a polymer-metal composite laminate sheet having high heat conductivity may be used since this sheet has higher output power and cooling performance and is therefore suitably used in a battery for a large device such as an electric vehicle or a hybrid electric vehicle. In particular, an exterior body made of an exterior material such as a laminate film having a three-layer structure in which PP, aluminum and nylon are laminated in this order, may be used.

(Battery Configuration)

As described above, the lithium ion secondary battery according to the embodiment of the present invention includes the battery constituent 10 in which a plurality of battery elements (electrode structures) 14 each including the positive electrode and the negative electrode connected to each other via the electrolyte layer, are stacked on top of each other. The lithium ion secondary battery has a structure in which the battery constituent 10 is housed in a battery case such as a can body or a laminate container (a package body).

The lithium ion secondary battery is divided into two types: a wound type battery having a structure in which positive electrodes 11, electrolyte layers 13 and negative electrodes 12 are wound, and a laminated type battery having a structure in which positive electrodes 11, electrolyte layers 13 and negative electrodes 12 are stacked. The battery shown in FIG. 5 and a bipolar battery have a laminated type structure. The battery is also referred to as a coin cell, a button battery or a laminated battery depending on the shape and structure of the battery case.

Examples

Hereinafter, the present invention is explained in more detail with reference to examples; however, the present invention is not limited to these examples.

[1] Preparation of Negative Electrode

As a sputtering apparatus, an independently controllable ternary DC magnetron sputtering apparatus (manufactured by Yamato-Kiki Industrial Co., Ltd.; combinatorial sputter coating apparatus; gun-sample distance: about 100 mm) was used. Thin films of negative electrode active material alloys having various constitutions were each formed with this apparatus on a substrate (a current collector) made of nickel foil having a thickness of 20 μm using the following targets under the following film formation conditions. Thus, 34 negative electrode samples having the constitutions shown in Tables 1 and 2 were obtained.

(1) Targets (manufactured by Kojundo Chemical Laboratory Co., Ltd.; purity: 4N)
Si: diameter of 50.8 mm; thickness of 3 mm (with backing plate of oxygen-free copper with thickness of 2 mm)
Sn: diameter of 50.8 mm; thickness of 5 mm
C: diameter of 50.8 mm; thickness of 3 mm (with backing plate of oxygen-free copper with thickness of 2 mm)

(2) Film Formation Conditions
Base pressure: up to $7 \times 10^{-6}$ Pa
Sputtering gas: Ar (99.9999% or higher)
Sputtering gas introduction amount: 10 sccm
Sputtering pressure: 30 mTorr
DC power source: Si (185 W), Sn (0 to 40 W), C (0 to 150 W)
Pre-sputtering time: 1 min.
Sputtering time: 10 min.
Substrate temperature: room temperature (25° C.)

Namely, in each example, the Si target, the Sn target and the C target were used, the sputtering time was set to 10 minutes, and the power level of the DC power source was changed in each target so as to be set to the respective ranges described above. Then, the alloyed thin films in an amorphous state were each formed on the Ni substrate so as to obtain the negative electrode samples including the alloyed thin films having various constitutions. Tables 1, 2 and FIG. 1 show the constituent composition of the respective alloyed thin films.

As for the sample preparation, for example, in Example 16, the DC power source 1 (the Si target) was set to 185 W, the DC power source 2 (the Sn target) was set to 35 W, and the DC power source 3 (the C target) was set to 110 W. In Comparative Example 2, the DC power source 1 (the Si target) was set to 185 W, the DC power source 2 (the Sn target) was set to 22 W, and the DC power source 3 (the C target) was set to 0 W. In Comparative Example 7, the DC power source 1 (the Si target) was set to 185 W, the DC power source 2 (the Sn target) was set to 0 W, and the DC power source 3 (the C target) was set to 30 W.

The obtained alloyed thin films were analyzed by use of the following analyzing method and analyzing device.

Composition analysis: SEM-EDX analysis (manufactured by JEOL Ltd.), EPMA analysis (manufactured by JEOL Ltd.)

Film thickness measurement (for calculating sputtering rate): film thickness meter (manufactured by Tokyo Instruments, Inc.)

Film state analysis: Raman spectroscopic analysis (manufactured by Bruker Corporation)

[2] Preparation of Batteries

Each negative electrode sample obtained as described above was placed to face the counter electrode (the positive electrode) made of lithium foil with a separator interposed therebetween, and an electrolysis solution was poured therein, so as to prepare a CR2032 type coin cell prescribed in IEC60086 for each example. The lithium foil used was lithium foil (manufactured by Honjo Metal Co., Ltd.) cut out in such a manner as to have a diameter of 15 mm and a thickness of 200 μm. The separator used was Celgard 2400 (manufactured by Celgard, LLC.).

The electrolysis solution used was prepared in a manner such that $LiPF_6$ (lithium hexafluorophosphate) was dissolved, at a concentration of 1 M, into a mixed non-aqueous solvent in which ethylene carbonate (EC) and diethyl carbonate (DEC) were mixed in the volume ratio of 1:1.

[3] Charge-Discharge Test of Batteries

Figure 6:
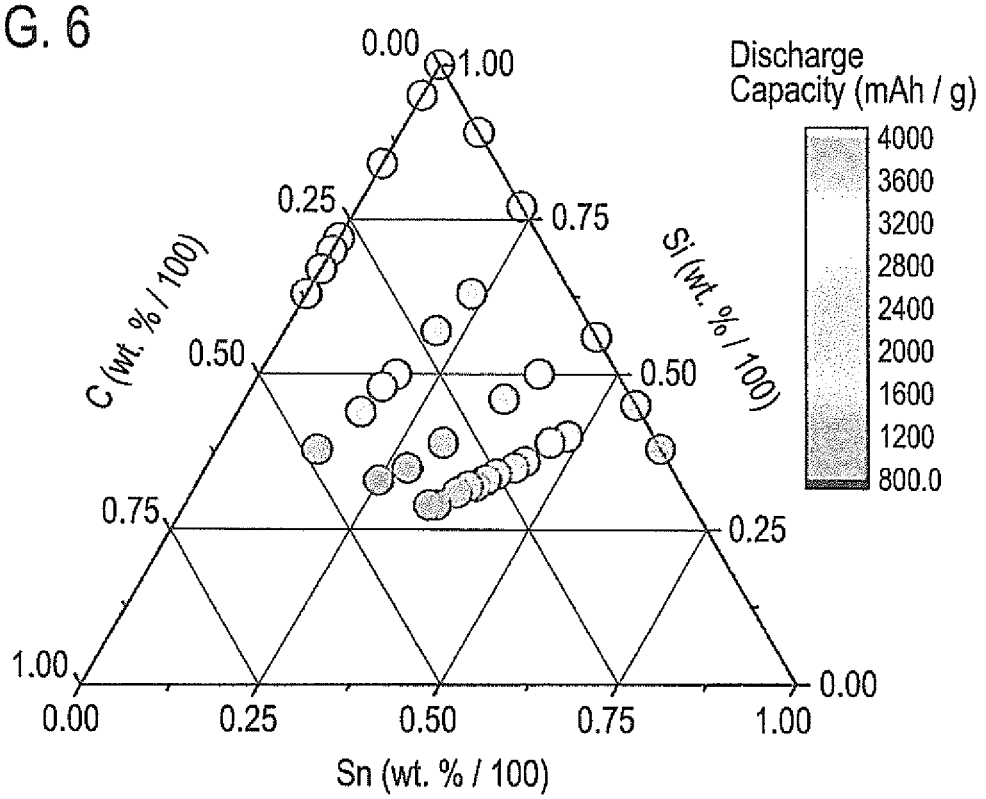
FIG. 6 is a diagram showing an influence of the alloy composition of the negative electrode active material on an initial discharge capacity in a battery prepared in each of Examples and Comparative Examples according to the present invention.
Figure 7:
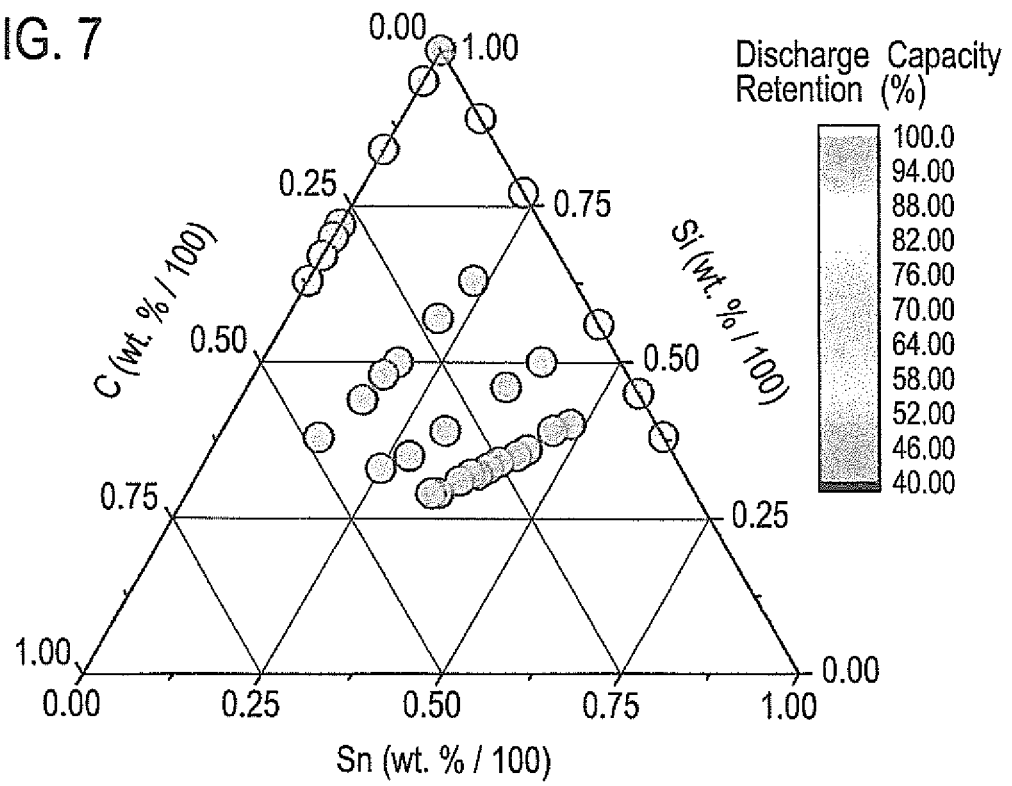
FIG. 7 is a diagram showing an influence of the alloy composition of the negative electrode active material on a discharge capacity retention at the 50th cycle in the battery prepared in each of Examples and Comparative Examples according to the present invention.
Figure 8:
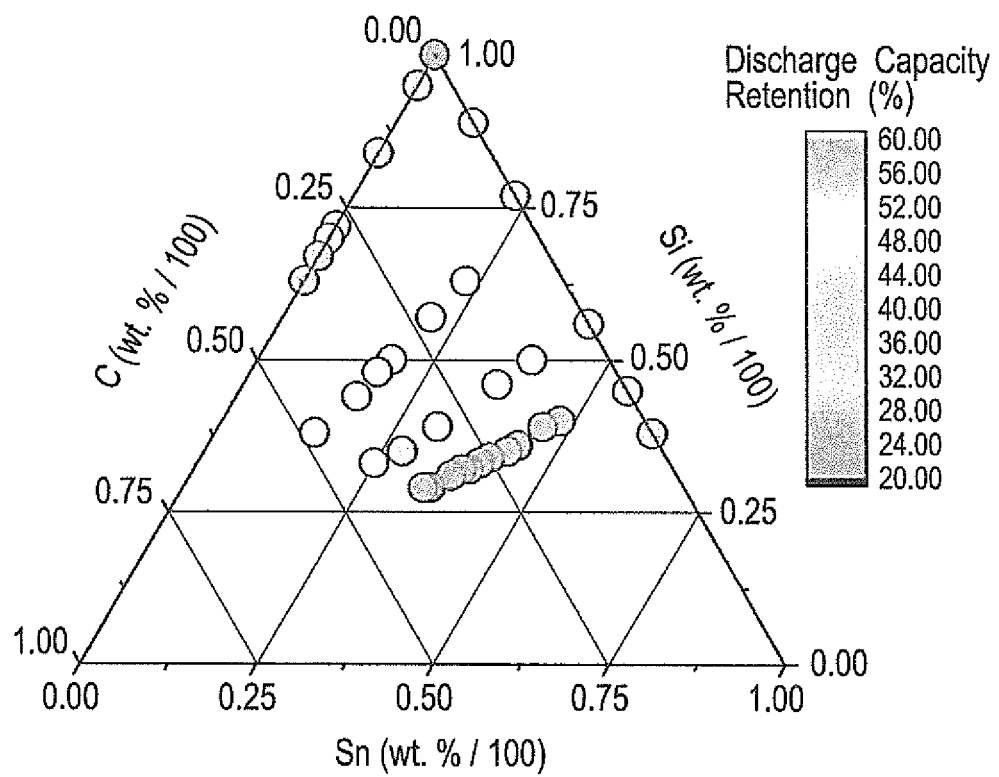
FIG. 8 is a diagram showing an influence of the alloy composition of the negative electrode active material on a discharge capacity retention at the 100th cycle in the battery prepared in each of Examples and Comparative Examples according to the present invention.

The batteries obtained as described above were each subjected to the following charge-discharge test. In particular, a charge-discharge tester (HJ0501SM8A, manufactured by Hokuto Denko Corporation) was used, and the respective batteries were charged and discharged in a thermostat bath (PFU-3K, manufactured by ESPEC Corp.) set at 300 K (27° C.). Each battery was charged at 0.1 mA from 2 V to 10 mV in constant current/constant voltage mode during charge, that is, in the process of Li intercalation to the negative electrode to be subjected to evaluation. After that, each battery was discharged at 0.1 mA from 10 mV to 2 V in constant current mode during discharge, that is, in the process of Li release from the negative electrode. This charge-discharge procedure was regarded as a single cycle and repeated 100 times. Then, the discharge capacities at the 50th cycle and at the 100th cycle were obtained so as to calculate the discharge capacity rates at the 50th cycle and at the 100th cycle as the discharge capacity retentions with respect to the discharge capacity at the 1st cycle. Tables 1 and 2 and FIG. 6 to FIG. 8 each show the results thus obtained. Here, the respective discharge capacities are indicated by values calculated per alloy weight.

TABLE 1

| Classification | Negative Electrode Active Material Components (%) | | | Discharge Capacity at 1st Cycle (mAh/g) | Discharge Capacity Retention (%) | |
|---|---|---|---|---|---|---|
| | Si | Sn | C | | at 50th Cycle | at 100th Cycle |
| Example 1 | 63 | 23 | 14 | 2134 | 92 | 45 |
| Example 2 | 57 | 21 | 22 | 2005 | 92 | 47 |
| Example 3 | 50 | 19 | 31 | 1632 | 92 | 48 |
| Example 4 | 48 | 18 | 34 | 1628 | 92 | 49 |
| Example 5 | 44 | 17 | 39 | 1571 | 92 | 50 |
| Example 6 | 38 | 14 | 48 | 1262 | 92 | 51 |
| Example 7 | 50 | 39 | 11 | 1710 | 92 | 48 |
| Example 8 | 46 | 36 | 18 | 1582 | 96 | 49 |
| Example 9 | 39 | 31 | 30 | 1310 | 95 | 52 |
| Example 10 | 35 | 28 | 37 | 1250 | 92 | 52 |
| Example 11 | 33 | 25 | 42 | 1089 | 92 | 52 |
| Example 12 | 40 | 48 | 12 | 1741 | 97 | 55 |
| Example 13 | 39 | 46 | 15 | 1685 | 98 | 56 |
| Example 14 | 36 | 44 | 20 | 1583 | 97 | 57 |
| Example 15 | 35 | 43 | 22 | 1525 | 96 | 55 |
| Example 16 | 34 | 41 | 25 | 1466 | 99 | 60 |
| Example 17 | 33 | 40 | 27 | 1456 | 97 | 57 |
| Example 18 | 32 | 39 | 29 | 1423 | 96 | 57 |
| Example 19 | 32 | 38 | 30 | 1403 | 97 | 58 |
| Example 20 | 31 | 37 | 32 | 1381 | 98 | 60 |
| Example 21 | 29 | 35 | 36 | 1272 | 97 | 60 |
| Example 22 | 29 | 34 | 37 | 1184 | 98 | 59 |

TABLE 2

| Classification | Negative Electrode Active Material Components (%) | | | Discharge Capacity at 1st Cycle (mAh/g) | Discharge Capacity Retention (%) | |
|---|---|---|---|---|---|---|
| | Si | Sn | C | | at 50th Cycle | at 100th Cycle |
| Comparative Example 1 | 100 | 0 | 0 | 3232 | 47 | 22 |
| Comparative Example 2 | 89 | 11 | 0 | 3149 | 78 | 36 |
| Comparative Example 3 | 77 | 23 | 0 | 2622 | 84 | 38 |
| Comparative Example 4 | 56 | 44 | 0 | 1817 | 91 | 42 |
| Comparative Example 5 | 45 | 55 | 0 | 1492 | 91 | 42 |
| Comparative Example 6 | 38 | 62 | 0 | 1325 | 91 | 42 |
| Comparative Example 7 | 95 | 0 | 5 | 3284 | 58 | 37 |
| Comparative Example 8 | 84 | 0 | 16 | 3319 | 64 | 38 |
| Comparative Example 9 | 72 | 0 | 28 | 3319 | 51 | 29 |
| Comparative Example 10 | 70 | 0 | 30 | 3409 | 68 | 33 |
| Comparative Example 11 | 67 | 0 | 33 | 3414 | 54 | 27 |
| Comparative Example 12 | 63 | 0 | 37 | 3360 | 59 | 27 |

The test results revealed that the batteries of Examples 1 to 22 each using the negative electrode active material including the Si—Sn—C series alloy containing greater than or equal to 29% by mass of Si and containing Sn, C and inevitable impurities as a residue, show the initial capacity exceeding at least 1000 mAh/g, and show the discharge capacity retention of greater than or equal to 92% after 50 cycles and the discharge capacity retention of greater than or equal to 45% even after 100 cycles.

Although the present invention has been described above by reference to the examples, the present invention is not limited to the descriptions thereof, and it will be apparent to those skilled in the art that various modifications and improvements can be made.

According to the present invention, the negative electrode active material for an electric device includes the Si—Sn—C series ternary alloy having the composition described above. The electric device, typically the lithium ion secondary battery, employing this negative electrode active material can improve the cycle life of the battery and ensure a high capacity and high cycle durability. Thus, the present invention is industrially applicable.

The invention claimed is:

1. A negative electrode active material for an electric device, comprising an amorphous alloy consisting of silicon in a range from 29% by mass to 44% by mass inclusive, tin in a range from 14% by mass to 48% by mass inclusive, carbon in a range from 11% by mass to 48% by mass inclusive and inevitable impurities as a residue, wherein an average particle diameter of the negative electrode active material is in a range from 1 μm to 20 μm.

2. A negative electrode for an electric device, comprising the negative electrode active material according to claim 1.

3. An electric device comprising the negative electrode active material according to claim 1.

4. The electric device according to claim 3 that is a lithium ion secondary battery.

5. The negative electrode active material for an electric device according to claim 1, wherein the amorphous alloy consists of silicon in a range from 29% by mass to 40% by mass inclusive, tin in a range from 34% by mass to 48% by mass inclusive, carbon in a range from 12% by pass to 37% by mass inclusive and inevitable impurities as a residue.

6. The negative electrode active material for an electric device according to claim 1, wherein tin is in a range of 14% by mass to 19% by mass inclusive.

7. The negative electrode active material for an electric device according to claim 1, wherein tin is in a range of 41% by mass to 48% by mass inclusive.

8. The negative electrode active material for an electric device according to claim 1, wherein carbon is in a range of 31% by mass to 48% by mass inclusive.

* * * * *